United States Patent [19]
Massironi

[11] Patent Number: 5,367,192
[45] Date of Patent: Nov. 22, 1994

[54] PACKAGE FOR INTEGRATED DEVICES

[75] Inventor: Angelo Massironi, Concorezzo, Italy

[73] Assignee: SGS-Thomson Microelectronics S.r.l., Catania, Italy

[21] Appl. No.: 165,043

[22] Filed: Dec. 6, 1993

Related U.S. Application Data

[63] Continuation of Ser. No. 183,209, Apr. 19, 1988, abandoned.

[30] Foreign Application Priority Data

Apr. 22, 1987 [IT]  Italy .................... 20210 A/87

[51] Int. Cl.$^5$ .................. H01L 23/48; H05K 1/08
[52] U.S. Cl. .................. 257/678; 257/692; 257/696
[58] Field of Search ............ 357/68, 74; 257/693, 257/678, 692, 696, 733; 339/17 C

[56] References Cited

U.S. PATENT DOCUMENTS

| | | | |
|---|---|---|---|
| 4,171,855 | 10/1979 | Raskin | 357/68 |
| 4,215,361 | 7/1980 | McCarthy | 357/68 |
| 4,247,981 | 2/1981 | Walters | 357/68 |
| 4,642,670 | 2/1987 | Striny | 357/68 |

FOREIGN PATENT DOCUMENTS

| | | | |
|---|---|---|---|
| 0159550 | 9/1984 | Japan | 357/68 |
| 0208863 | 11/1984 | Japan . | |
| 0047448 | 3/1985 | Japan | 357/68 |
| 0144047 | 7/1986 | Japan | 357/74 |
| 0252157 | 11/1987 | Japan . | |

*Primary Examiner*—Viet Q. Nguyen
*Attorney, Agent, or Firm*—Guido Modiano; Albert Josif; Daniel O'Byrne

[57] ABSTRACT

This package for integrated devices, to be fixed on supporting plates, in particular on printed circuits, comprises contact pins to be inserted in holes of the supporting plates and to be soldered thereto. To prevent overturning of the package, which may lead to short circuits among the components, at least some of the contact pins are provided with protruding portions defining abutments cooperating with the supporting plate to limit the inclination of the package with respect to the plate.

20 Claims, 1 Drawing Sheet

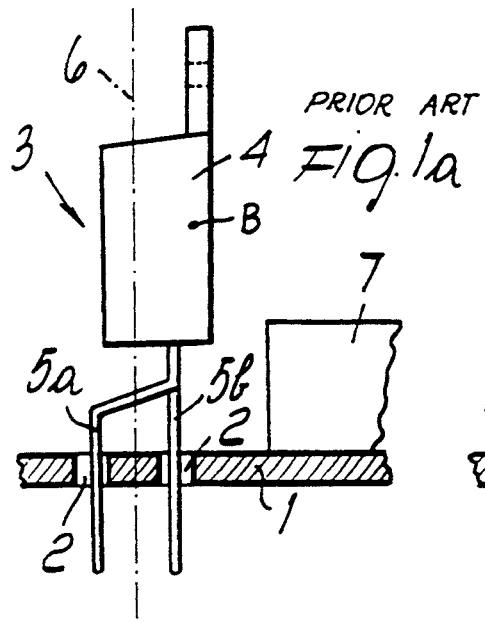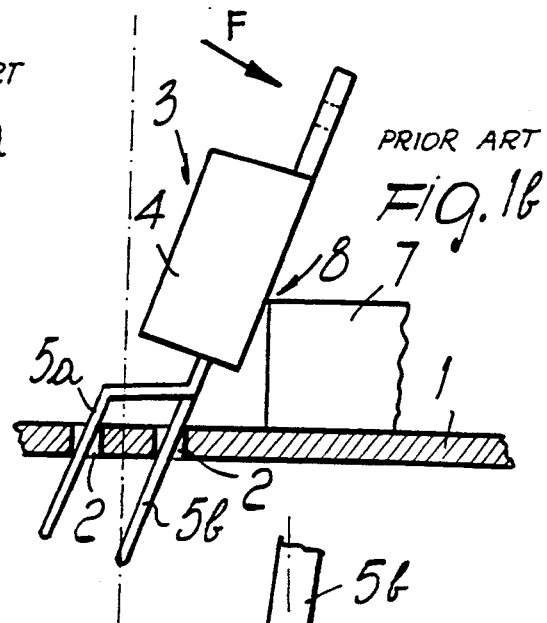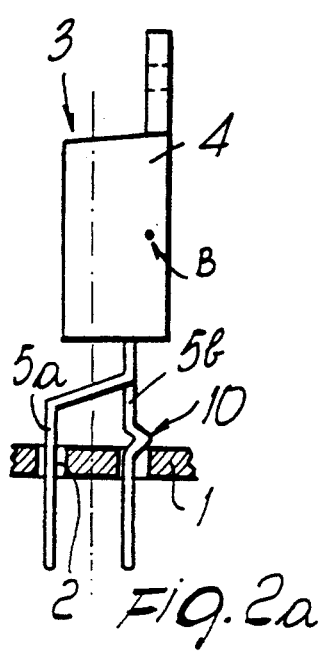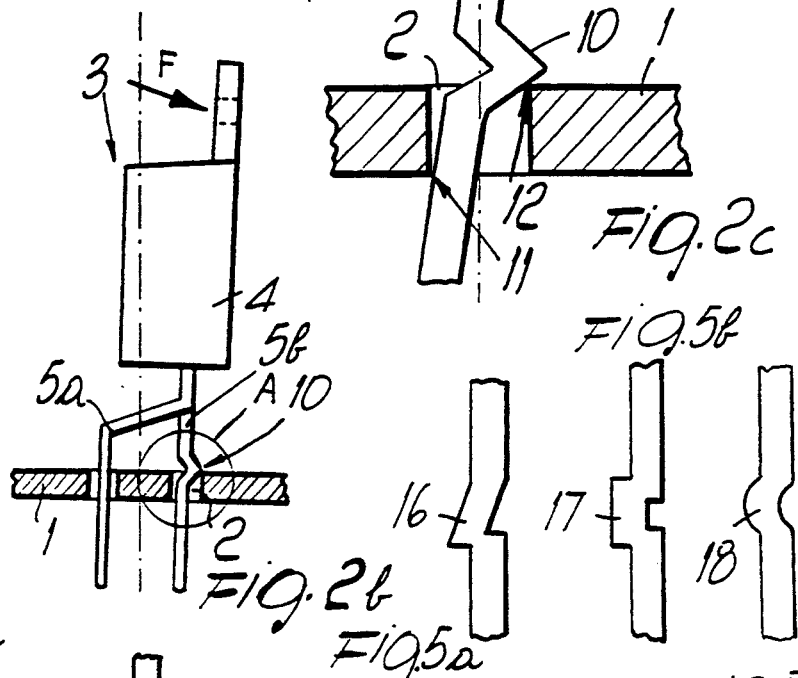

1

PACKAGE FOR INTEGRATED DEVICES

This is a continuation application of application Ser. No. 07/183,209 filed Apr. 19, 1988, now abandoned.

BACKGROUND OF THE INVENTION

The present invention relates to a package for integrated devices.

As is known, packages for integrated devices which must be fixed to printed circuits are initially placed in position on the printed circuit by inserting the pins of the package in the appropriate holes provided in the plate having the printed circuit thereon, and then finally soldered or welded.

Accordingly, until the final soldering, the packages, not being fixed to the supporting plate, may be subject to oscillations or movements which move them away from the position which they should assume and in some cases can even cause a short circuit among adjacent components. This risk is more present in packages in which the center of gravity of the system is not arranged centrally with respect to the supporting pins, for example in the so-called single-in-line packages. In fact this type of package generally comprises two or more integrated devices mounted on a common substrate and provided with pins for connection to the printed circuit. In this case, the center of gravity may be greatly displaced with respect to the vertical plane passing through the center of the pins or of the rows of pins constituting the terminals of the device or devices. This situation is also due to the fact that usually the pins of the packages have a cross section considerably smaller than that of the holes, to facilitate their insertion in said holes even in case of not perfect centering with respect to the required position. Typically, therefore, for pins 0.7 mm wide, holes with a diameter comprised between 1 and 1.2 mm are provided.

SUMMARY OF THE INVENTION

Given this situation, the aim of the present invention is to provide a package of the indicated type, capable of solving the above described problem, and in particular of eliminating or at least considerably reducing the possibility of inclination of the package of the integrated device with respect to the desired vertical position, so as to reliably prevent the occurrence of undesired short circuits among the different components to be fixed to a printed circuit.

Within this aim, a particular object of the present invention is to provide a package which has a simple and cheap structure and does not alter the criteria currently used for fixing the package to said printed circuit.

Not least object of the present invention is to provide a package which can be temporarily fixed to the supporting plate with the printed circuit, awaiting for the final soldering.

This aim, the objects mentioned and others which will become apparent hereinafter, are achieved by a package for integrated devices as defined in the accompanying claims.

BRIEF DESCRIPTION OF THE DRAWINGS

The features and advantages of the invention will become apparent from the description of some preferred but not exclusive embodiments, illustrated only by way of nonlimitative example in the accompanying drawings, wherein:

FIGS. 1a and 1b illustrate the behaviour of a known package;

FIGS. 2a to 2c illustrate the behaviour of a similar package, produced however according to the invention;

FIG. 3 is a view of a variated aspect of the solution shown in FIGS. 2a-2c;

FIG. 4 shows another variated aspect for packages of a different type; and

FIGS. 5a to 5c illustrate possible embodiments of the abutment elements according to the invention.

DESCRIPTION OF THE PREFERRED EMBODIMENTS

Reference should initially be made to FIGS. 1a and 1b, illustrating the structure and the behaviour of an exemplifying package produced according to the prior art. In the figure, 1 indicates the supporting plate defining a printed circuit, having holes 2 for the insertion of the pins, indicated here at 5a and 5b, of a package of a known type. In the specific case a package, generally indicated at 3, with seven pins and identified by the name HEPTAWATT (registered trade-mark), has been illustrated. Said package comprises a body 4 and a plurality of pins arranged along two parallel rows, of which only the pin 5a of the front row and the pin 5b of the rear row are visible. In the shown example, three other front pins 5a and two other rear pins 5b, conveniently offset, are however present. In the figure the center of gravity of the complete device has been indicated at B and, as is apparent in the figure, is arranged greatly behind the vertical plane (indicated by the dot-and-dash line 6) defined by the midline between the rows of pins. A further device 7, which may be constituted by a component of any type, has also been indicated schematically on the plate 1. As illustrated in FIG. 1b, due to the eccentric position of the center of gravity B, a force F acting on the package 3 (though with a very small value) causes the inclination or the overturning of the package 3 which, in the illustrated case, leads to the formation of a short circuit in the point indicated at 8. This situation is clearly to be avoided so that the overall circuit may reliably operate.

FIGS. 2a to 2c illustrate instead a first embodiment according to the invention. Here the package 3, for example of the same type shown in FIGS. 1a and 1b, again comprises a body 4 and a plurality of arrayed front pins 5a and a plurality of arrayed rear pins 5b which are inserted in the through holes 2 of a plate 1, which defines a plane of lay thereof. According to this first embodiment, however, the contact pins indicated at 5b (that is those arranged closest to the vertical plane passing through the center of gravity) are provided with protruding portions indicated at 10. In the specific case, the projection 10 of the illustrated pin 5b is constituted by a region of said pin which has been refolded outwardly, for example stamped by means of a punch, on the already formed pin.

The supporting plane 1 has on one side thereof a first surface parallel to the plane of lay thereof and facing the integrated device 4. On the opposite side the supporting plate 1 has a second surface coexestensive with said first surface and facing away from the integrated device 4. The through holes 2 cross the supporting plate and define therewith internal wall means 2a delimiting internally said through holes 2 and forming intersection edges 2b, 2c defining the cross-sectional size of the through hole 2. The cross-sectional size of the through holes 2 is greater than the cross-sectional size of the contact pins so that the latter may be easily inserted into the holes 2.

Said protruding portion defines an abutment cooperating with i.e. engaging an edge of the through hole 2 to prevent or at least limit the inclination of the pins and of the entire package with respect to the plane perpendicular to the plane of lay of the plate.

This behaviour is illustrated in FIG. 2b and in the enlarged detail of FIG. 2c. In fact, under the action of a force F acting on the upper part of the package, due to the eccentric position of the center of gravity, the package still tends to overturn backwards, but in this case this rotation is severely limited by the presence of the projection 10. In fact, as can be seen in FIG. 2c, the inclination of the pin 5b causes the pin to rest against the edges of the plate 1 at the point 11 on the front side of said pin and at the point 12 at the projection 10. The projection 10 therefore behaves like an abutment which prevents a further inclination of the pin and therefore of the package with respect to the plate 1. As can be seen from the comparison of FIGS. 1b and 2c (in which the effect has been in any case emphasized for exemplifying reasons) in practice the pin 5b provided with the projection 10 inclines itself with respect to the vertical to the plate 1 by a much smaller angle than that possible with a package of the conventional type. Said reduced inclination prevents therefore the contact of the package 3 with further components of the circuit, reliably avoiding thereby the onset of short circuits.

FIG. 3 illustrates a different embodiment from the one illustrated in FIGS. 2a–2c. In this case, the projection, indicated at 13, is a V-shaped refolded portion of the pin and has been formed so as to face the row of pins 5a and with such dimensions that refolded portion 13 of the pin 5b, has in unassembled condition a width only slight greater or substantially equal to that of the hole 2. In this case therefore the package must be inserted in the plate by exerting a slight pressure thereon so as to obtain a slight snap coupling of the pin 5b inside the hole 2. Said snap coupling force need not be high by virtue of the approximately equal dimensions of the hole and of the pin at the projection and by virtue of the high elasticity of said pin. In this case the projection 13 prevents any oscillation of the pins and therefore of the package 3 with respect to the plate and furthermore allows a pre-fixing of said package within the plate 1, also preventing the accidental slipping out of the package from the holes 2 in a vertical direction.

FIG. 4 illustrates another solution, possible in the case of a package of a different type, having a body 4' provided with a plurality of pins arranged along a single row. In this case the pins, indicated at 15a and 15b, have been provided with projections 14 alternately facing one side or the other of the row of said pins. In this manner swinging of the package in one direction or the other is prevented. However, if the center of gravity of the system is greatly displaced towards one of the two sides thereof, also in this case, the pins may be exclusively provided with projections extending all in the same direction.

FIGS. 5a–5c illustrate different configurations of the projections which may be formed on the pins according to the invention. In particular, 16 indicates a solution having a triangular profile and having an undercut, while the projection indicated at 17 and illustrated in FIG. 5b has a rectangular configuration. The solution illustrated in FIG. 5c, instead, has a curved projection indicated at 18, substantially free from discontinuity surfaces.

As visible (see in particular FIG. 4), the pins 5a 5b, 15a, 15b are substantially straight flat leads to be loosely inserted in the holes of the supporting plate and to be soldered thereto at substantially right angle. The pins extend parallel to each other along one (FIGS. 2a–2c and 3) or two (FIG. 4) rows, while the protruding portions 10, 13, 14, 16–18 define means for allowing only limited inclination or tilting of the package with respect to the supporting plate.

As is apparent from the preceding description, the invention fully achieves the intended objects. In fact, by virtue of the provision of a protruding surface on at least some of the pins for fixing packages to a perforated plate, any possible inclination of the package is reduced or completely eliminated, thereby effectively preventing an overturning thereof and its resting against adjacent components of the same circuit, with the possibility of short circuit.

Moreover, said projections may be simply obtained by stamping or drawing formed pins, with production costs which are generally modest and in any case much smaller than the costs required for the search of the defectively soldered components according to the prior art.

Furthermore, in the case of the embodiment such as illustrated in FIG. 3, a pre-fixing of the components in their seats is obtained which may be advantageous to prevent the movement of said components before soldering, for example in cases where the plate with the mounted but as yet unsoldered components must be moved.

The invention thus conceived is susceptible to numerous modifications and variations, all of which are within the scope of the inventive concept. In particular the protruding portions provided on the pins may be directed towards one side or the other, as illustrated, may be formed at different heights of said pins, according to the requirements, and entail a size of the pin at the projection greater or approximately equal to the diameter of the hole, as already indicated. Furthermore, though according to the preferred embodiment, due to cost reasons, the projections according to the invention are provided preferably by stamping on already formed pins, the projections may be simultaneously formed with the pins.

Furthermore, the materials employed, the shapes and dimensions may be any according to the requirements, and all the details may be replaced with other technically equivalent ones.

I claim:

1. A package for integrated devices, to be fixed onto a supporting plate having holes, said holes defining edges at the intersections with said plate, said package comprising a plurality of substantially straight contact pins to be loosely inserted in the holes of the supporting plate and to be soldered thereto, said contact pins extending at a substantially right angle with respect to the supporting plate, said contact pins having a diameter that is substantially smaller than that of said holes, said contact pins extending parallel to each other, wherein at least some of said contact pins have means for allowing only limited inclination of the package with respect to the supporting plate, said means being configured to rest on said supporting plate, and defining therewith abutments cooperating with the respective edges of the holes of the support plate.

2. A package according to claim 1, wherein said contact pins are arranged along a single row of pins, said row having two opposite sides, the abutments of adjacent pins being arranged at opposite sides of said row.

3. A package for integrated devices, to be fixed onto a supporting plate having holes, said holes defining edges at the intersections with said plate, said packaging comprising a plurality of substantially straight, flat contact pins to be loosely inserted in the holes of the supporting plate and to be soldered thereto, said contact pins extending at a substantially right angle with respect to the supporting plate, said contact pins having a diameter that is substantially smaller than that of said holes, said contact pins extending parallel to each other along two parallel rows, wherein at least some of said contact pins of one row comprise protruding portions having a greater width than the holes of the supporting plate, said protruding portion being configured for rested on said supporting plate and defining abutments cooperating with the respective edges of the holes of the supporting plate to allow limited inclination of the package with respect to the supporting plate.

4. A package for integrated devices, of the single-in-line type to be fixed onto a support plate having holes, said holes defining edges at the intersection with said plate, said package comprising plurality of substantially straight contact pins to be loosely inserted in the holes of the supporting plate and to be soldered thereto, said contact pins having a diameter that is substantially smaller than that of said holes, said contact pins extending at a substantially right angle with respect to the supporting plate, said contact pins extending parallel to each other along a first and a second parallel rows, said package having a center of gravity arranged eccentrically with respect to said rows of pins and closer to said first than to said second row of pins, wherein at least some of the contact pins of the first row comprise a protruding portion having a greater width than the holes of the supporting plate, said protruding portions being configured for resting on said supporting plate, and defining an abutment cooperating with the respective edges of the holes of the supporting plate to allow limited inclination of the package with respect to the supporting plate.

5. A package according to claim 4, wherein said first row of pins defines a side oriented toward said center of gravity, said protruding portions being arranged at said side.

6. A package according to claim 4, wherein said first row of pins defines a side oppositely oriented with respect to said second row of pins and toward said center of gravity, said protruding portion being arranged at said side.

7. A package according to claim 4, wherein said protruding portions extend perpendicularly with respect to the longitudinal axis of said contact pins.

8. A package according to claim 4, wherein each of said straight contact pin defines longitudinal axis, said protruding portions being formed by a folding of the contact pins protruding out laterally from said longitudinal axis.

9. A package according to claim 8, wherein said folding is stamped by means of a punch.

10. A package for integrated devices to be fixed unto a supporting plate having holes, said holes defining edges at the intersection with said plate, said package comprising a plurality of substantially straight contact pins to be loosely inserted in the holes of said supporting plate ant to be soldered thereto, said contact pins having a diameter that is substantially smaller than that of said holes, said pins extending at a substantially right angle with respect to the supporting plate, said contact pins extending parallel to each other, wherein at least some of said contact pins have means for allowing only a limited inclination of said package with respect to said supporting plate, said means including protrusions with a width substantially equal to that of said holes, said protrusions engaging in a snap coupling said holes.

11. A package according to claim 10, wherein said contact pins are arranged along a single row, of pins, said row having two opposite sides, said means of said contact pins including abutments, the abutments of adjacent pins being arranged at different sides of said row.

12. A package for integrated devices to be fixed unto a supporting plate having holes with a selected opening width, said holes defining edges at the intersection with said plate, said package comprising a plurality of substantially straight contact pins to be inserted in the holes of said supporting plate and to be soldered thereto, said contact pins having a diameter that is substantially smaller than that of said holes, said pins extending at a substantially right angle with respect to the supporting plate, said contact pins extending parallel to each other, wherein at least some of said contact pins have means for substantially preventing inclination of said package with respect to said supporting plate, said means including protrusion with a width which, in unassembled condition is normally slightly greater than the opening width of said holes, said protrusions engaging in a snap coupling said holes.

13. A package for integrated devices in combination with a supporting plate, said supporting plate having on one side thereof a first surface facing said integrated device, said first surface defining plane of lay for said integrated device, and on the opposite side of said first surface a second surface coextensive with said first surface and facing away from said integrated device, said supporting plate further comprising through holes crossing said supporting plate and defining therewith internal wall means and forming at said first and second surfaces opposite inter-section edges defining a contour of said through holes at said first and said second surface, said through holes having a cross-sectional opening area of a first selected cross-sectional size, said integrated package comprising a body and a plurality of arrayed substantially straight contact pins extending from said body and inserted into said through holes, said contact pins having a cross-sectional area of a second selected cross-sectional size, said contact pins having said second cross-sectional size substantially smaller than said first cross-sectional size of said through holes, said first selected cross-sectional size being greater than said second cross-sectional size thereby to allow easy insertion of said contact pins into said holes, at least some of said contact pins having abutment means in engagement with said internal wall means to substantially prevent unwanted inclination of said contact pins with respect to said plane of lay of said plate.

14. A combination according to claim 13, wherein said contact pins are arranged such as to form at least one row.

15. A combination according to claim 13, wherein said contact pins are arranged according to at least one row defining opposite sides thereof and wherein said abutment means face alternatively towards said opposite sides of said row.

16. A combination according to claim 13, wherein said abutment means are V-shaped refolded portions of said contact pins in engagement with said internal walls of said holes.

17. A combination according to claim 16, wherein said refolded portions have in unassembled condition a width slightly greater than the cross-sectional opening size of said holes thereby to provide a snap engagement with said internal walls.

18. A combination according to claim 16, wherein said refolded portions have the shape of a shoulder.

19. A combination according to claim 16, wherein said refolded portions have a concave shape.

20. A combination according to claim 16, wherein said refolded portions have a convex shape.

* * * * *